(12) United States Patent
Sun

(10) Patent No.: US 10,273,150 B2
(45) Date of Patent: Apr. 30, 2019

(54) INTEGRATED STRUCTURE OF MEMS MICROPHONE AND PRESSURE SENSOR AND MANUFACTURING METHOD FOR THE INTEGRATED STRUCTURE

(71) Applicant: Goertek.Inc, Weifang, Shandong (CN)

(72) Inventor: Yanmei Sun, Weifang (CN)

(73) Assignee: Goertek.Inc, Weifang, Shandong (CN)

( * ) Notice: Subject to any disclaimer, the term of this patent is extended or adjusted under 35 U.S.C. 154(b) by 8 days.

(21) Appl. No.: 15/554,653

(22) PCT Filed: Dec. 14, 2015

(86) PCT No.: PCT/CN2015/097315
§ 371 (c)(1),
(2) Date: Aug. 30, 2017

(87) PCT Pub. No.: WO2016/192373
PCT Pub. Date: Dec. 8, 2016

(65) Prior Publication Data
US 2018/0050902 A1 Feb. 22, 2018

(30) Foreign Application Priority Data

May 29, 2015 (CN) .......................... 2015 1 0287121

(51) Int. Cl.
*H04R 31/00* (2006.01)
*G01L 7/08* (2006.01)
(Continued)

(52) U.S. Cl.
CPC ............ *B81B 7/02* (2013.01); *B81C 1/00158* (2013.01); *G01L 7/08* (2013.01); *H04R 19/005* (2013.01);
(Continued)

(58) Field of Classification Search
CPC .............. B81B 7/02; B81B 2201/0257; B81B 2201/0264; B81B 2203/0127;
(Continued)

(56) References Cited

U.S. PATENT DOCUMENTS

| 7,795,063 B2 | 9/2010 | Hsieh et al. |
| 2013/0161702 A1 | 6/2013 | Chen |

(Continued)

FOREIGN PATENT DOCUMENTS

| CN | 102158787 A | 8/2011 |
| CN | 102180435 A | 9/2011 |

(Continued)

OTHER PUBLICATIONS

Written Opinion dated Mar. 8, 2016 in International Patent Application No. PCT/CN2015/097315.
(Continued)

*Primary Examiner* — Roy K Potter
(74) *Attorney, Agent, or Firm* — Michele V. Frank; Venable LLP

(57) ABSTRACT

The present invention discloses a manufacturing method of an integrated structure of a MEMS microphone and a pressure sensor, which comprises the following steps: depositing an insulating layer, a first polycrystalline silicon layer, a sacrificial layer and a second polycrystalline silicon layer in sequence on a shared substrate; etching the second polycrystalline silicon layer to form a vibrating diaphragm and an upper electrode; eroding the sacrificial layer to form a containing cavity of a microphone and a pressure sensor, and etching the sacrificial layer between the microphone and the pressure sensor; etching the first polycrystalline silicon layer to form a back electrode of the microphone and a lower electrode of the pressure sensor; etching a position of the shared substrate below a back electrode of the microphone (Continued)

to form a back cavity; and etching away the region of the insulating layer below the back electrode. A capacitance structure of a MEMS microphone and that of a pressure sensor are integrated on a shared substrate, improving integration of a MEMS microphone and a pressure sensor, and greatly reducing a size of a whole packaging structure; in addition, a microphone and a pressure sensor can be simultaneously manufactured on a shared substrate to improve the efficiency of production.

10 Claims, 5 Drawing Sheets

(51) Int. Cl.
  *B81B 7/02* (2006.01)
  *H04R 19/04* (2006.01)
  *B81C 1/00* (2006.01)
  *H04R 19/00* (2006.01)

(52) U.S. Cl.
  CPC ............. *H04R 19/04* (2013.01); *H04R 31/00* (2013.01); *B81B 2201/0257* (2013.01); *B81B 2201/0264* (2013.01); *B81C 2201/013* (2013.01); *B81C 2201/0105* (2013.01); *H04R 2201/003* (2013.01)

(58) Field of Classification Search
  CPC ........ B81C 1/00214; B81C 2201/0109; B81C 2201/013; H04R 19/005; H04R 2201/003; G01L 1/148
  See application file for complete search history.

(56) References Cited

U.S. PATENT DOCUMENTS

2015/0274506 A1* 10/2015 Feyh .................. F01D 15/10
                                                         257/416
2016/0304336 A1* 10/2016 Schoen ............. B81C 1/00214

FOREIGN PATENT DOCUMENTS

| CN | 104045052 A | 9/2014 |
| CN | 104883652 A | 9/2015 |
| CN | 204681590 U | 9/2015 |

OTHER PUBLICATIONS

International Search Report dated Mar. 8, 2016 in International Patent Application No. PCT/CN2015/097315.

* cited by examiner

INTEGRATED STRUCTURE OF MEMS MICROPHONE AND PRESSURE SENSOR AND MANUFACTURING METHOD FOR THE INTEGRATED STRUCTURE

CROSS REFERENCE TO RELATED APPLICATION

This application is a national stage application, filed under 35 U.S.C. § 371, of International Application No. PCT/CN2015/097315, filed on Dec. 14, 2015, which claims priority to Chinese Application No. 201510287121.3 filed on May 29, 2015, the content of which is hereby incorporated by reference in its entirety.

FIELD OF THE INVENTION

The present disclosure relates to the field of sensors, more particularly, to an integrated structure of a MEMS microphone and a pressure sensor; and the present disclosure further relates to a manufacturing method for an integrated structure of the MEMS microphone and the pressure sensor.

BACKGROUND OF THE INVENTION

In recent years, along with the development of science and technology, a size of electronic products such as a mobile phone and a laptop is continuously reduced, and people's requirement on performance of these portable electronic products is also higher and higher, which requires reducing the size of electronic parts mated therewith accordingly.

As a measuring device, a sensor has been popularly applied to electronic products such as mobile phones and laptops. In a prior process structure, a pressure sensor and a MEMS microphone are packaged on a PCB (Printed Circuit Board) in a form of two independent single bodies. Then a series of processes such as DB and WB are carried out, and the size of the products made by such a packaging form is larger, which is unfavorable for application of consumer electronics. The present problem is that packaging process of sensors has been more mature, the process capability has approached to the limit, and it is hard to further reduce the size of a chip as required by a system manufacturer.

SUMMARY OF THE INVENTION

An objective of the present disclosure is to provide a new technical solution of a manufacturing method for an integrated structure of a MEMS microphone and a pressure sensor.

According to one aspect of the present disclosure, there is provided a manufacturing method for an integrated structure of a MEMS microphone and a pressure sensor, which comprises the following steps:

a) depositing an insulating layer and a first polycrystalline silicon layer in sequence on a shared substrate;

b) depositing a sacrificial layer and a second polycrystalline silicon layer continuously in sequence above the first polycrystalline silicon layer;

c) etching a second polycrystalline silicon layer to form a vibrating diaphragm of a MEMS microphone and an upper electrode of the pressure sensor;

d) eroding the sacrificial layer to form a containing cavity of a MEMS microphone and a pressure sensor, and eroding the sacrificial layer between the MEMS microphone and the pressure sensor;

e) etching the first polycrystalline silicon layer to form a back electrode of the MEMS microphone and a lower electrode of the pressure sensor;

f) etching a position of the shared substrate below a back electrode of the MEMS microphone to form a back cavity; and g) etching away the region of the insulating layer below the back electrode.

Preferably, the step c) further comprises a step of etching the second polycrystalline silicon layer to form a corrosion hole for corrosion material to penetrate through, wherein the corrosion hole is on the vibrating diaphragm and the upper electrode; and the method further comprises, between the step d) and the step e), a step of depositing a polycrystalline silicon thin film on the vibrating diaphragm and the upper electrode continuously to form a flange on the corrosion hole, wherein the flange is located on lower ends of the vibrating diaphragm and the upper electrode.

Preferably, the method further comprises, after forming the flange, a step of thinning the vibrating diaphragm.

Preferably, the step d) further comprises a step of eroding the sacrificial layer to form a through hole penetrating through the vibrating diaphragm and the first polycrystalline silicon layer, as well as the upper electrode and the first polycrystalline silicon layer in the sacrificial layer respectively; and further comprises a step of manufacturing a metal part in the through hole to lead out an electric signal of the first polycrystalline silicon layer.

Preferably, in the step g), an airflow leading-out hole is etched to form on the back electrode and the insulating layer below the back electrode at first, and then a region of the insulating layer below the back electrode is etched away.

The present disclosure further provides an integrated structure of an MEMS microphone and a pressure sensor, the integrated structure comprising: a shared substrate, wherein a vibrating diaphragm and a back electrode forming a MEME microphone, as well as a sacrificial layer supporting between the vibrating diaphragm and the back electrode are disposed on the shared substrate; an upper electrode and a lower electrode forming the pressure sensor, as well as a sacrificial layer supporting between the upper electrode and the lower electrode are further disposed on the shared substrate; a position of the shared substrate corresponding to the back electrode is provided with a back cavity; and the back electrode is suspended above the back cavity.

Preferably, an insulating layer is provided at a position where shared substrate and the back electrode contact with the lower electrode.

Preferably, the sacrificial layer of the MEME microphone and pressure sensor is provided with a through hole penetrating through the back electrode and the vibrating diaphragm, as well as the lower electrode and the upper electrode respectively, and a metal part for leading out electric signal of the back electrode and lower electrode is disposed in the through hole.

Preferably, a plurality of flanges extending to the back electrode is disposed on a end face at one side of the vibrating diaphragm adjacent to the back electrode; and a plurality of flanges extending to the lower electrode is disposed on a end face at one side of the upper electrode adjacent to the lower electrode.

Preferably, the flange is inverted cone-shaped.

According to the integrated structure of the present disclosure, a capacitance structure of a MEMS microphone and that of a pressure sensor are integrated on a shared substrate, improving integration of a MEMS microphone and a pressure sensor, and greatly reducing a size of a whole packaging structure. Meanwhile, a vibrating diaphragm of a MEMS microphone and a upper electrode of a pressure sensor can use the same material and manufacturing process, and a back electrode of a MEMS microphone and a lower electrode of a pressure sensor can use the same material and manufacturing process, making it possible to manufacture a MEMS microphone and a pressure sensor simultaneously on a shared substrate to improve the efficiency of production.

The inventor of the present disclosure has found that in prior art, the sensor packaging process has been more mature and the process capability has approached to the limit, and it is hard to further reduce the size of a chip as required by a system manufacturer. Therefore, the technical mission to be achieved or the technical problem to be solved in the present disclosure is unintentional or unanticipated to the skilled in the art, and thus the present invention refers to a novel technical solution.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the disclosure and, together with the description thereof, serve to explain the principles of the present disclosure.

DETAILED DESCRIPTION OF THE EMBODIMENTS

Figure 1:
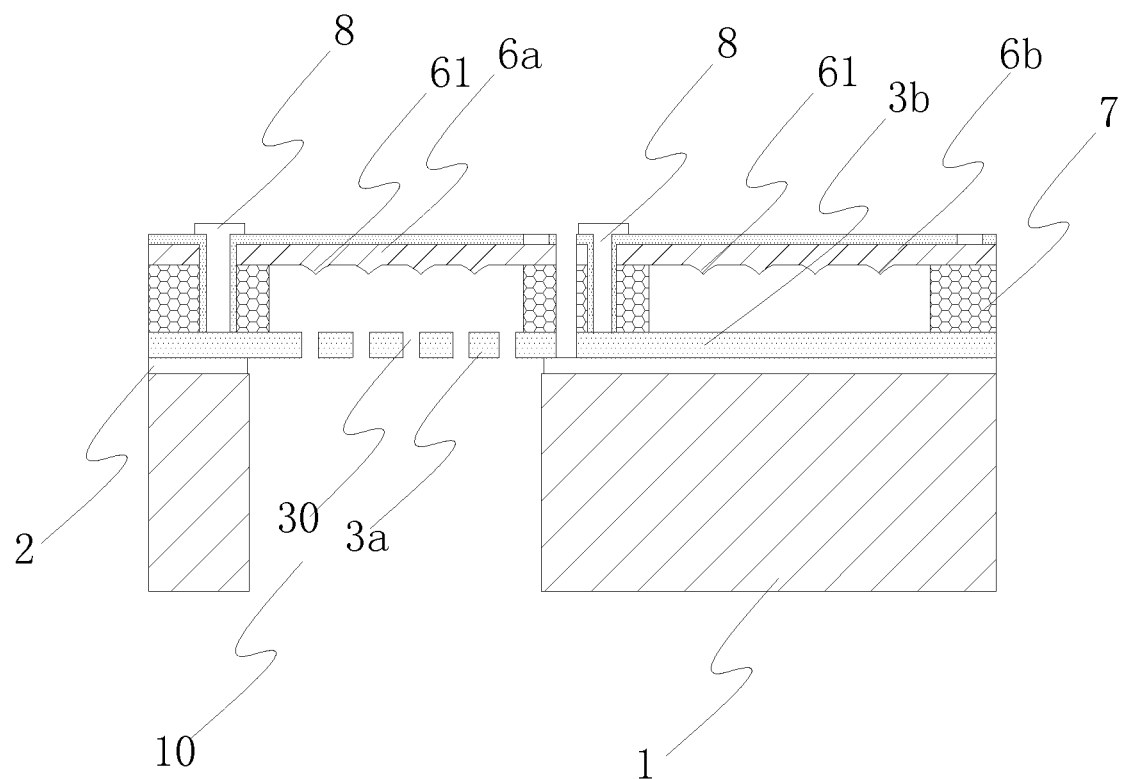
FIG. 1 is a schematic diagram of an integrated structure of the present disclosure.

Various exemplary embodiments of the present disclosure will now be described in detail with reference to the drawings. It should be noted that the relative arrangement of the components and steps, the numerical expressions, and numerical values set forth in these embodiments do not limit the scope of the present disclosure unless it is specifically stated otherwise.

The following description of at least one exemplary embodiment is merely illustrative in nature and is in no way intended to limit the disclosure, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed in the accompanying drawings.

Referring to FIG. 1, in order to reduce the overall size of integral packaging, the present disclosure provides an integrated structure of a MEMS microphone and a pressure sensor, which comprises a shared substrate 1, and a capacitance structure of a MEMS microphone and that of a pressure sensor are disposed on the upper end of the shared substrate.

Specifically, the capacitance structure of the pressure sensor in the present disclosure comprises a lower electrode 3b and an upper electrode 6b, which are disposed on the shared substrate 1, and a sacrificial layer 7 supporting the upper electrode 6b above the lower electrode 3b. Because of the sacrificial layer 7, a certain distance exists between the upper electrode 6b and the lower electrode 3b, and by means of a traditional lead, a device converting pressure into an electric signal can be formed. For example, when subjected to an external force, the upper electrode 6b is deformed, the distance between the upper electrode 6b and the lower electrode 3b is changed, and finally a changed electric signal is output.

The capacitance structure of the MEMS microphone in the present t disclosure comprises a back electrode 3a and a vibrating diaphragm 6a which are disposed above the shared substrate 1, and a sacrificial layer 7 supporting between the back electrode 3a and the vibrating diaphragm 6a. For those skilled in the art, the capacitance structure of the MEMS microphone can adopt a manner that the vibrating diaphragm 6a is disposed above and the back electrode 3a is disposed below, and can also adopt a manner that the vibrating diaphragm 6a is disposed below and the back electrode 3a is disposed above. In one detailed embodiment, in order to correspond to the pressure sensor, the capacitance structure of the MEMS microphone adopts a structure that the vibrating diaphragm 6a is disposed above and the back electrode 3a is disposed below, that is to say, the back electrode 3a is disposed on the shared substrate 1, and the vibrating diaphragm 6a is supported above the back electrode 3a through the sacrificial layer 7, so that a certain distance exists between the vibrating diaphragm 6a and the back electrode 3a. And by means of a traditional lead, a device converting voice signal into electric signal can be formed. An action principle of the capacitance structure of the MEMS microphone is well known to those skilled in the art, and is not repeated herein.

In order to enable the capacitance structure of the MEMS microphone to play a role, the position on the shared substrate 1 corresponding to the back electrode 3a is provided with a back cavity 10, so that the back electrode 3a suspends above the back cavity 10. Meanwhile, a plurality of airflow leading-out holes 30 is disposed on the back electrode 3a to balance airflow between a front cavity and a back cavity of the MEMS microphone.

In the present disclosure, the shared substrate 1 can be made of monocrystalline silicon material, and the back electrode 3a, the vibrating diaphragm 6a, the lower electrode 3b and the upper electrode 6b could be made of polycrystalline silicon material, which are well known to those skilled in the art. For insulation, an insulating layer 2 is disposed in a position where the back electrode 3a and the lower electrode 3b make a contact with the shared substrate 1, and the insulating layer 2 is preferably made of silicon dioxide material.

According to the integrated structure of the present disclosure, a capacitance structure of the MEMS microphone and that of the pressure sensor are integrated on the shared substrate, improving the integration of the MEMS microphone and the pressure sensor and greatly reducing an overall size of the packaging structure. Meanwhile, the vibrating diaphragm of the MEMS microphone and the upper electrode of the pressure sensor can use the same material and manufacturing process, and the back electrode of the MEMS microphone and the lower electrode of the pressure sensor can use the same material and manufacturing process, making it possible to manufacture a MEMS microphone and a pressure sensor simultaneously on a shared substrate to improve the efficiency of production.

According to the integrated device of the present disclosure, as abovementioned, the vibrating diaphragm and the back electrode as well as the upper electrode and the lower electrode can be connected by means of a traditional lead. In one detailed embodiment, the sacrificial layer 7 of the MEMS microphone and pressure sensor is provided with a through hole penetrating through the back electrode 3a and the vibrating diaphragm 6a, as well as the lower electrode 3b and the upper electrode 6b respectively. A metal part 8 electrically connected to the back electrode 3a and the lower electrode 3b is disposed in the through hole, and through the metal part 8, electric signal of the back electrode 3a and lower electrode 3b is led out.

In another embodiment, a plurality of flanges 61 extending to the back electrode 3a is disposed on a end face at one side of the vibrating diaphragm 6a adjacent to the back electrode 3a; and a plurality of flanges 61 extending to the lower electrode 3b is disposed on a end face at one side of the upper electrode 6b adjacent to the lower electrode 3b. The shape of the flanges 61 preferably adopts an inverted cone shape, and the flanges 61 can be uniformly distributed on the surfaces of the vibrating diaphragm 6a and upper electrode 6b. When a pressure subjecting to the vibrating diaphragm 6a and the upper electrode 6b is larger, causing larger deformation of the vibrating diaphragm 6a and the upper electrode 6b, preventing the vibrating diaphragm 6a and the upper electrode 6b, as well as the back electrode 3a and the lower electrode 3b from being attached together, to avoid failure of the MEMS microphone and the pressure sensor.

Figure 2:
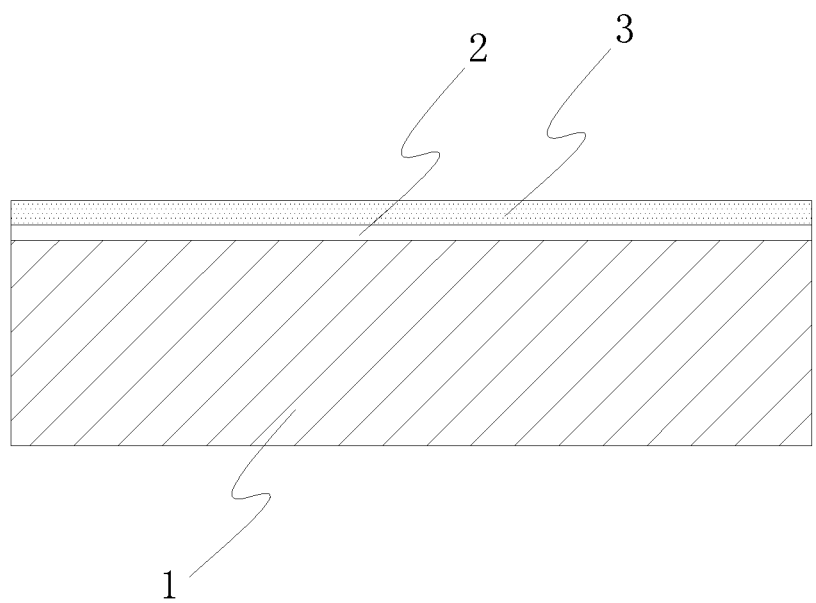
FIGS. 2-10 are process flowcharts of a manufacturing method for the integrated structure of the present disclosure.
Figure 3:
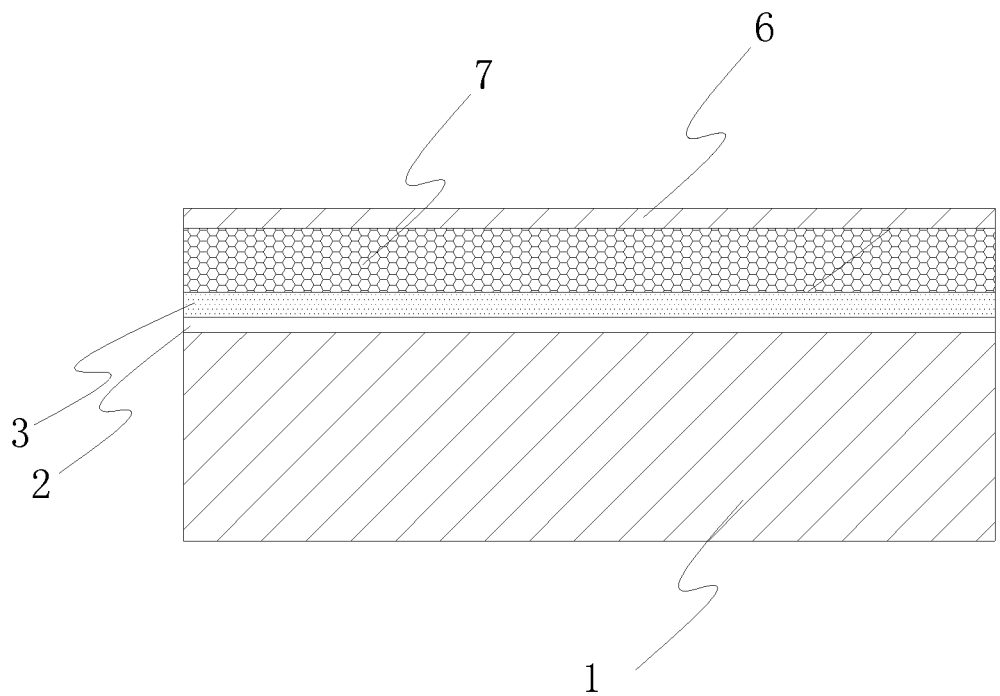
Figure 4:
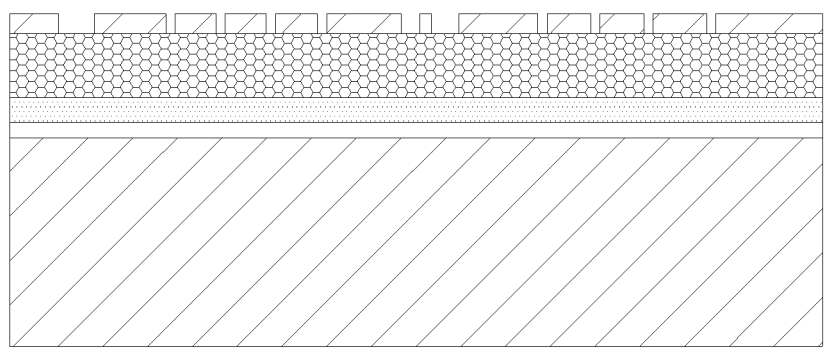
Figure 5:
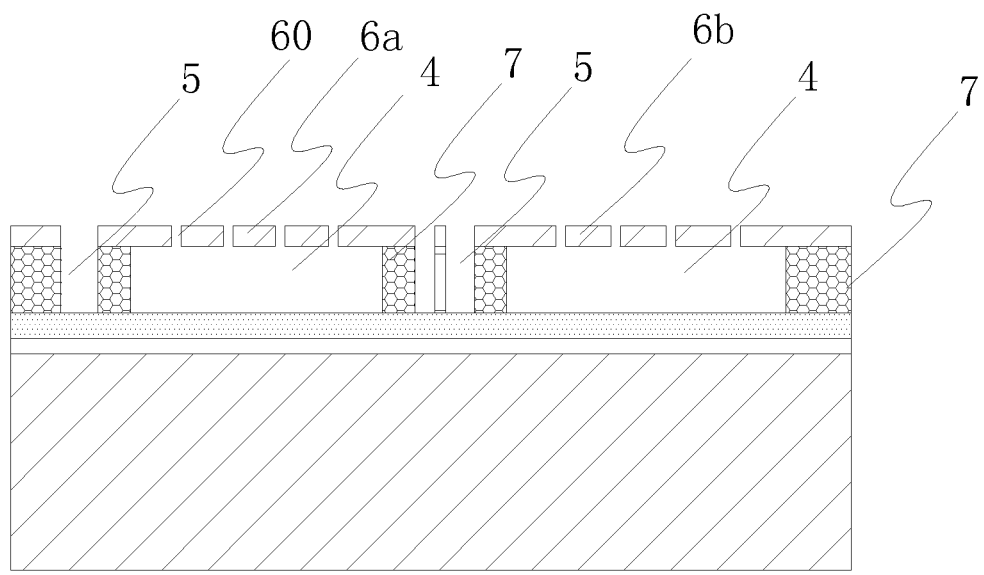
Figure 7:
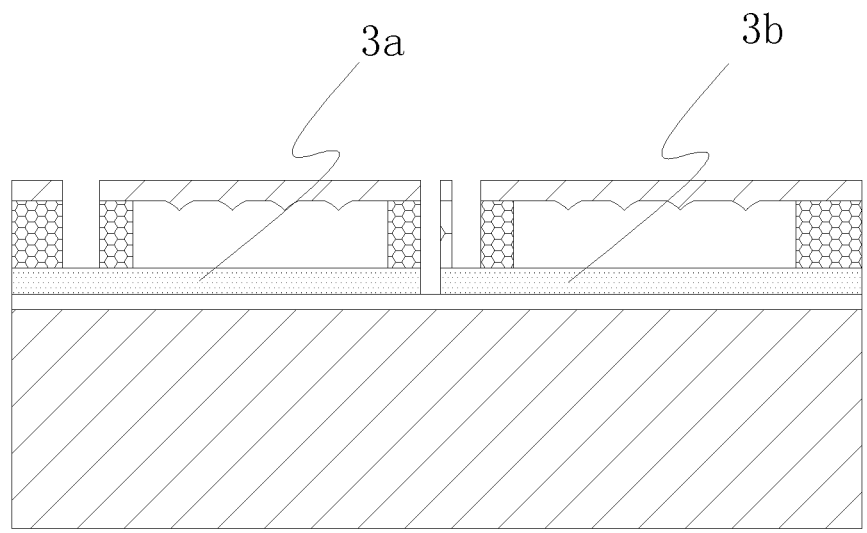
Figure 9:
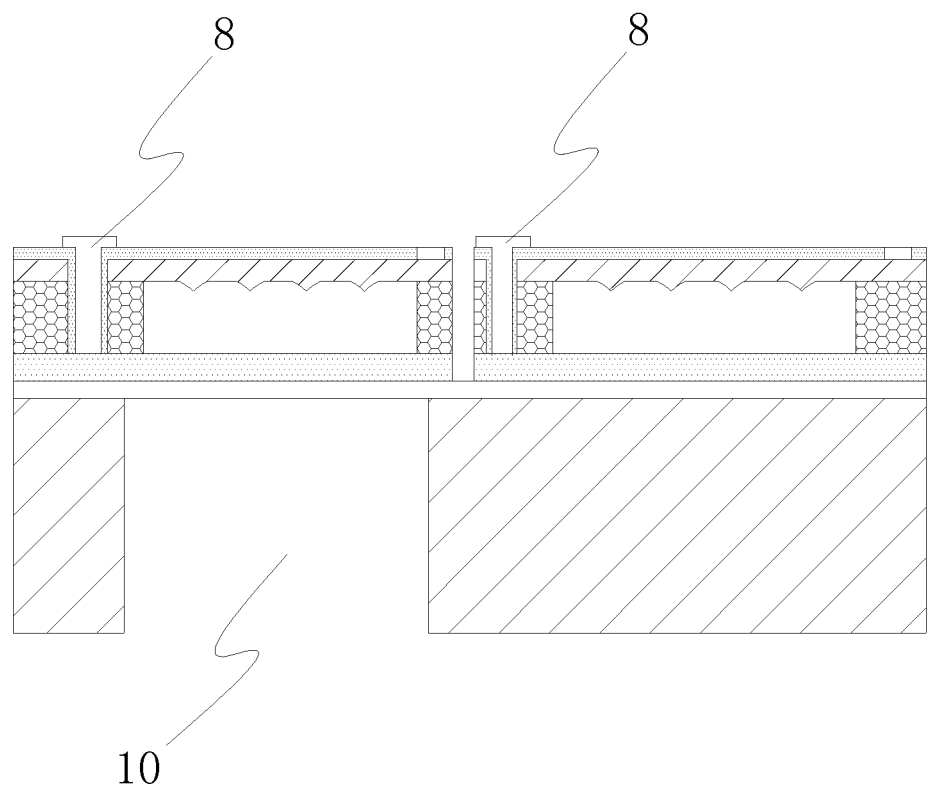
Figure 10:
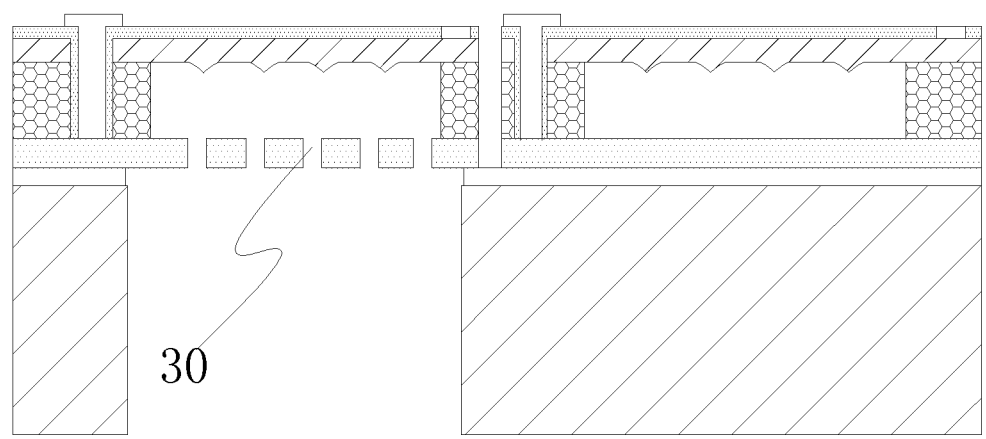

The present disclosure further provides a manufacturing method for an integrated structure of a MEMS microphone and a pressure sensor, which comprises the following steps.

a) An insulating layer 2 and a first polycrystalline silicon layer 3 are deposited on a shared substrate 1 in sequence, referring to FIG. 2; wherein while ensuring that the shared substrate 1 and the first polycrystalline silicon layer 3 are insulated, the insulating layer 2 can also serve as a barrier layer in a subsequent bulk silicon corrosion process, to avoid a damage to an upper layer structure;

b) A sacrificial layer 7 and a second polycrystalline silicon layer 6 are continuously in sequence deposited on an upper surface of the first polycrystalline silicon layer 3, referring to FIG. 3;

c) The second polycrystalline silicon layer 6 is etched to form a vibrating diaphragm 6a of a MEMS microphone and an upper electrode 6b of a pressure sensor; in this step, according to working parameter requirements of the MEMS microphone and the pressure sensor, the second polycrystalline silicon layer 6 is etched in a predetermined position to form a vibrating diaphragm 6a of a MEMS microphone and an upper electrode 6b of a pressure sensor respectively, referring to FIG. 4;

d) The sacrificial layer 7 is eroded. A part of the sacrificial layer 7 between the vibrating diaphragm 6a and the first polycrystalline silicon layer 3 is eroded, so that the vibrating diaphragm 6a is supported on the first polycrystalline silicon layer 3 only by the sacrificial layer at its edge position; similarly, a part of the sacrificial layer 7 between the upper electrode 6b and the first polycrystalline silicon layer 3 is eroded, such that the upper electrode 6b is supported on the first polycrystalline silicon layer 3 only by the sacrificial layer at its edge position; and a containing cavity 4 of the MEMS microphone and pressure sensor as shown in FIG. 4 is formed; in this step, a region of the sacrificial layer between the MEMS sensor and the pressure sensor is etched to separate the MEMS sensor from the pressure sensor, referring to FIG. 5;

e) A region of the first polycrystalline silicon layer 3 between the MEMS sensor and the pressure sensor is etched, so that signal of the MEMS microphone and the pressure sensor are independent, to form a back electrode 3a of the MEMS microphone and a lower electrode 3b of the pressure sensor, referring to FIG. 7;

f) A position of the shared substrate 1 below the back electrode 3a of the MEMS microphone is etched, to form a back cavity 10, referring to FIG. 9.

g) The insulating layer 2 below the back electrode 3a is etched away, so that the back electrode 3a is suspended above back cavity 10, referring to FIG. 10.

As abovementioned, the technique of releasing the vibrating diaphragm 6a and the upper electrode 6b by eroding the sacrificial layer 7 is well known to those skilled in the art. In one preferred embodiment, the step c) also comprises a step of etching the second polycrystalline silicon layer 6 to form a corrosion hole 60 for corrosion material to penetrate through, wherein the corrosion hole 60 is on the vibrating diaphragm 6a and the upper electrode 6b, referring to FIG. 4; and through the corrosion hole 60, corrosion material can be smoothly introduced to the sacrificial layer 7 to erode the same.

Figure 6:
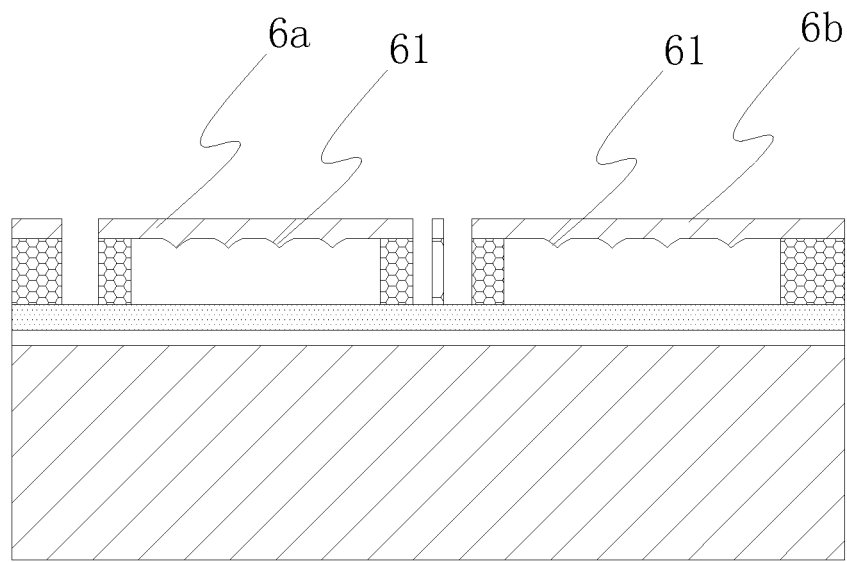

At this point, the method further comprises, between the step d) and the step e), a step of continuously depositing a polycrystalline silicon thin film on the vibrating diaphragm 6a and the upper electrode 6b, wherein the polycrystalline silicon thin film enters into the corrosion hole 60, to form the flange 61 on the corrosion hole 60, wherein the flange 61 is located on lower ends of the vibrating diaphragm 6a and the upper electrode 6b, referring to FIG. 6; and through the flange 61, the vibrating diaphragm 6a and the upper electrode 6b, as well as the back electrode 3a and the lower electrode 3b are prevented from being attached together to cause a failure of the MEMS microphone and the pressure sensor.

In the manufacturing method of the present disclosure, the vibrating diaphragm 6a of the MEMS microphone and the upper electrode 6b of the pressure sensor adopt the same material. In order to realize respective working parameters, when the second polycrystalline silicon layer 6 is etched in the step c), a larger size area of the upper electrode 6b is selected, and a smaller size area of the vibrating diaphragm 6a is selected. In one preferred embodiment, the method further comprises, after forming the flange 61, a step of thinning an upper surface of the vibrating diaphragm 6a, and working parameter requirements of the MEMS microphone and pressure sensor are realized by thickness of respective sensitive structure diaphragm layer.

Figure 8:
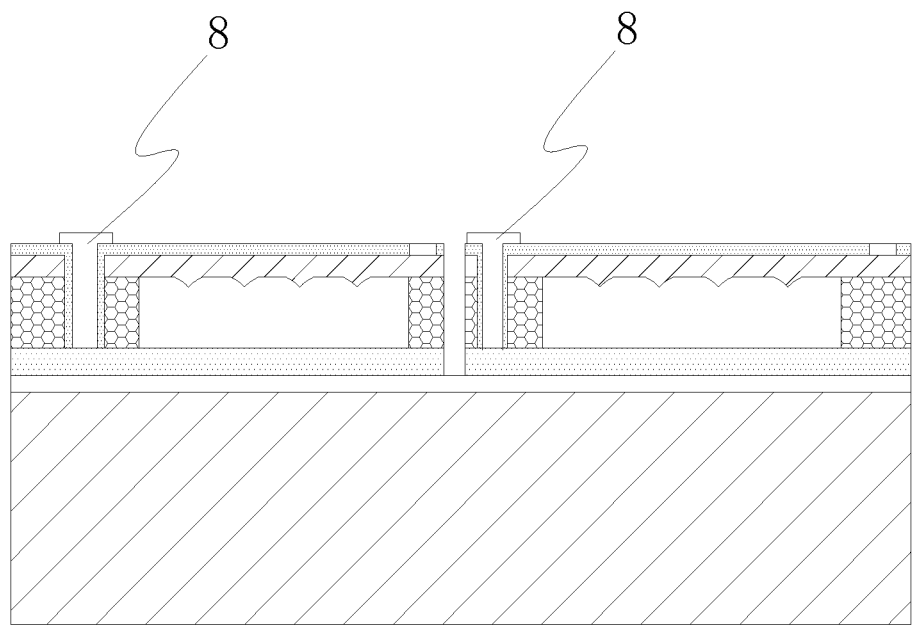

As abovementioned, the back electrode 3a and the vibrating diaphragm 6a, as well as the lower electrode 3b and the upper electrode 6b could also be connected by a traditional lead. In the manufacturing method of the present disclosure, the step d) further comprises a step of eroding the sacrificial layer 7 to form a through hole 5 penetrating through the vibrating diaphragm 6a and the first polycrystalline silicon layer 3 as well as the upper electrode 6b and the first polycrystalline silicon layer 3 respectively; wherein a metal part 8 is manufactured, such as depositing, in the through hole 5 to lead out signal in a position on the first polycrystalline silicon layer 3 for forming the back electrode 3a and the lower electrode 3b, referring to FIG. 8. Subsequently, the first polycrystalline silicon layer 3 is etched to form the back electrode 3a and the lower electrode 3b independently, so that respective signal is also independent. Of course, it is well known to those skilled in the art, that an insulating layer is required to be disposed between the metal part 8 and the vibrating diaphragm 6a, as well as the upper electrode 6b to prevent the metal part 8 from being electrically connected to the vibrating diaphragm 6a and the upper electrode 6b; and meanwhile, that the vibrating diaphragm 6a and the upper electrode 6b are further provided with metal electrodes to lead out the respective signal.

In the step g) of the manufacturing method of the present disclosure, an airflow leading-out hole 30 is etched to form on the back electrode 3a, as well as on the insulating layer 2 below the back electrode 3a at first, and then a region of the insulating layer 2 below the back electrode 3a is etched away, avoiding a damage to the back electrode 3a in etching process.

According to the manufacturing method of the present disclosure, a capacitance structure of a MEMS microphone and that of a pressure sensor can be manufactured on a shared substrate simultaneously, improving the efficiency of manufacturing and saving the cost of manufacturing.

Although some specific embodiments of the present invention have been demonstrated in detail with examples, it should be understood by a person skilled in the art that the above examples are only intended to be illustrative but not to limit the scope of the present invention. It should be understood by those skilled in the art that the above embodiments could be modified without departing from the scope and spirit of the present invention. The scope of the present invention is defined by the appended claims.

The invention claimed is:

1. A manufacturing method for an integrated structure of a MEMS microphone and a pressure sensor, comprising the following steps:
   a) depositing an insulating layer and a first polycrystalline silicon layer in sequence on a shared substrate;
   b) depositing a sacrificial layer and a second polycrystalline silicon layer continuously in sequence above the first polycrystalline silicon layer;
   c) etching the second polycrystalline silicon layer to form a vibrating diaphragm of a MEMS microphone and an upper electrode of the pressure sensor;
   d) eroding the sacrificial layer to form a containing cavity of a MEMS microphone and a pressure sensor, and eroding the sacrificial layer between the MEMS microphone and the pressure sensor;
   e) etching the first polycrystalline silicon layer to form a back electrode of the MEMS microphone and a lower electrode of the pressure sensor;
   f) etching a position of the shared substrate below the back electrode of the MEMS microphone to form a back cavity; and
   g) etching away the region of the insulating layer below the back electrode.

2. The manufacturing method according to claim 1, in the step c), further comprising, a step of etching the second polycrystalline silicon layer to form a corrosion hole for corrosion material to penetrate through, wherein the corrosion hole is on the vibrating diaphragm and the upper electrode; and between the step d) and the step e), further comprising, a step of depositing a polycrystalline silicon thin film on the vibrating diaphragm and the upper electrode continuously to form a flange on the corrosion hole, wherein the flange is located on lower end of the vibrating diaphragm and the upper electrode.

3. The manufacturing method according to claim 2, further comprising, after forming the flange, a step of thinning the vibrating diaphragm.

4. The manufacturing method according to claim 1, wherein the step d) further comprises a step of eroding the sacrificial layer to form a through hole penetrating through the vibrating diaphragm and the first polycrystalline silicon layer, as well as the upper electrode and the first polycrystalline silicon layer respectively; and further comprises a step of manufacturing a metal part in the through hole to lead out an electric signal of the first polycrystalline silicon layer.

5. The manufacturing method according to claim 1, wherein in the step g), an airflow leading-out hole is etched to form on the back electrode and the insulating layer below the back electrode at first, and then a region of the insulating layer below the back electrode is etched away.

6. An integrated structure of a MEMS microphone and a pressure sensor, the integrated structure comprising: a shared substrate, wherein a vibrating diaphragm and a back electrode forming a MEME microphone, as well as a sacrificial layer supporting between the vibrating diaphragm and the back electrode are disposed on the shared substrate; an upper electrode and a lower electrode forming the pressure sensor, as well as a sacrificial layer supporting between the upper electrode and the lower electrode are further disposed on the shared substrate; a position of the shared substrate corresponding to the back electrode is provided with a back cavity; and the back electrode is suspended above the back cavity.

7. The integrated structure according to claim 6, wherein an insulating layer is provided at a position where shared substrate and the back electrode contact with the lower electrode.

8. The integrated structure according to claim 6, wherein the sacrificial layer of the MEME microphone and pressure sensor is provided with a through hole penetrating through the back electrode and the vibrating diaphragm, as well as the lower electrode and the upper electrode respectively; and a metal part for leading out electric signal of the back electrode and lower electrode is disposed in the through hole.

9. The integrated structure according to claim 6, wherein a plurality of flanges extending to the back electrode is disposed on a end face at one side of the vibrating diaphragm adjacent to the back electrode; and a plurality of flanges extending to the lower electrode is disposed on a end face at one side of the upper electrode adjacent to the lower electrode.

10. The integrated structure according to claim 6, wherein the flange is inverted cone-shaped.

* * * * *